United States Patent
Metz (10) Patent No.: US 8,382,997 B2
(45) Date of Patent: Feb. 26, 2013

(54) METHOD FOR HIGH ASPECT RATIO PATTERNING IN A SPIN-ON LAYER

(75) Inventor: Andrew W. Metz, Loundonville, NY (US)

(73) Assignee: Tokyo Electron Limited, Tokyo (JP)

( * ) Notice: Subject to any disclaimer, the term of this patent is extended or adjusted under 35 U.S.C. 154(b) by 275 days.

(21) Appl. No.: 12/856,785

(22) Filed: Aug. 16, 2010

(65) Prior Publication Data

US 2012/0037592 A1 Feb. 16, 2012

(51) Int. Cl.
*B44C 1/22* (2006.01)

(52) U.S. Cl. ............... 216/49; 216/41; 216/48; 216/55; 438/781

(58) Field of Classification Search ............ 216/41, 216/42, 47, 49, 48, 55; 438/736, 737, 780, 438/781; 430/312, 313
See application file for complete search history.

(56) References Cited

U.S. PATENT DOCUMENTS

| | | | |
|---|---|---|---|
| 5,652,084 A | 7/1997 | Cleeves | |
| 7,795,148 B2 * | 9/2010 | Brown | 438/694 |
| 2006/0014360 A1 * | 1/2006 | Matsumoto | 438/424 |
| 2006/0068540 A1 * | 3/2006 | Min et al. | 438/202 |
| 2008/0006945 A1 * | 1/2008 | Lin et al. | 257/758 |
| 2008/0171447 A1 | 7/2008 | Wallow et al. | |
| 2009/0011374 A1 * | 1/2009 | Chang et al. | 430/323 |
| 2009/0191474 A1 * | 7/2009 | Sun et al. | 430/5 |
| 2009/0280438 A1 | 11/2009 | Kohno et al. | |
| 2010/0170871 A1 | 7/2010 | Sone et al. | |

FOREIGN PATENT DOCUMENTS

| | | |
|---|---|---|
| WO | 2008070060 A2 | 6/2008 |
| WO | 2010004979 A1 | 1/2010 |
| WO | 2011037809 A1 | 3/2011 |

OTHER PUBLICATIONS

European Patent Office, Invitation to Pay Additional Fees issued in corresponding International Application No. PCT/US2011/047541 dated Nov. 21, 2011, 7 pp.

European Patent Office, International Search Report and Written Opinion issued in corresponding International Application No. PCT/US2011/047541 dated Feb. 10, 2012, 19 pp.

* cited by examiner

*Primary Examiner* — Lan Vinh
(74) *Attorney, Agent, or Firm* — Wood, Herron & Evans, LLP (57) ABSTRACT

A method of patterning a substrate is described. The method includes preparing a film stack on a substrate, wherein the film stack comprises a spin-on layer, and heating the spin-on layer to a cure temperature less than a thermal decomposition temperature of the spin-on layer and exceeding about 200 degrees C. to increase mechanical strength of the spin-on layer. The method further includes forming a feature pattern without pattern collapse in the spin-on layer, wherein the feature pattern is characterized by a critical dimension less than 35 nm (nanometers) and an aspect ratio relating a height of the feature pattern to the critical dimension exceeding 5:1.

20 Claims, 7 Drawing Sheets

METHOD FOR HIGH ASPECT RATIO PATTERNING IN A SPIN-ON LAYER

BACKGROUND OF THE INVENTION

1. Field of Invention

The invention relates to a method for patterning a substrate and, in particular, a method for patterning a substrate with mechanically robust, high aspect ratio features in a spin-on layer.

2. Description of Related Art

In material processing methodologies, such as those used in the fabrication of micro-electronic devices, pattern etching is often utilized to define the intricate patterns associated with various integrated circuit elements. Pattern etching comprises preparing a pattern in a layer of photo-sensitive material, such as photo-resist, using lithographic patterning, and transferring the pattern formed in the layer of photo-sensitive material to the substrate by etching.

The lithographic patterning of the photo-sensitive material generally involves coating an upper surface of the substrate with a thin film of photo-sensitive material and then exposing the thin film of photo-sensitive material to a pattern of radiation by projecting radiation from a radiation source through a mask using, for example, a photolithography system. Thereafter, a developing process is performed, during which the removal of the irradiated regions of the photo-sensitive material occurs (as in the case of positive-tone photo-resist), or the removal of non-irradiated regions occurs (as in the case of negative-tone photo-resist). The remaining photo-sensitive material exposes the underlying substrate surface to a pattern that is ready to be etched into the surface.

Typically, this pattern may be transferred to a hard mask layer, which provides greater etch resistance for pattern transfer to more critical, underlying layers, such as insulation layers in metal interconnects for back-end-of-line (BEOL) operations, or transistor gate stacks for front-end-of-line (FEOL) operations. One hard mask material in common use today includes amorphous carbon, which is deposited using chemical vapor deposition (CVD) or variations thereof. However, lithographic patterning schemes that incorporate amorphous carbon layers as a hard mask layer suffer from high cost of ownership (CoO), low productivity, and particle contamination, to name a few disadvantages.

Therefore, more recently, spin-on materials have gained some popularity in lithographic patterning schemes even though these spin-on materials are perceived to be less etch resistant and less mechanically robust when subjected to other process steps in micro-electronic device fabrication process flows. The latter handicap is only exacerbated as feature sizes shrink to accommodate the increasing demand for smaller, faster micro-electronic devices. In particular, the requirements imposed upon lithographic patterning schemes, as described above, only become more challenging in an effort to avoid catastrophic failure, such as pattern collapse.

Moreover, while material processing technology has enabled a significant reduction in the lateral dimensions of these features, the thickness of layers or the height of structures decreases at a lesser rate, thus, leading to an escalating aspect ratio for these features. The increased aspect ratio combined with the decreased lateral dimension, particularly in lithographic layers, has only increased the susceptibility to the aforementioned failures. For example, when high aspect ratio features are patterned in spin-on layers, pattern collapse may occur resulting from an imbalance in surface tensile stress imposed during wet cleaning process steps.

SUMMARY OF THE INVENTION

The invention relates to a method for patterning a substrate and, in particular, a method for patterning a substrate with mechanically robust, high aspect ratio features.

According to one embodiment, a method of patterning a substrate is described. The method includes preparing a film stack on a substrate, wherein the film stack comprises a spin-on layer, and heating the spin-on layer to a cure temperature less than a thermal decomposition temperature of the spin-on layer and exceeding about 200 degrees C. to increase mechanical strength of the spin-on layer. The method further includes forming a feature pattern without pattern collapse in the spin-on layer, wherein the feature pattern is characterized by a critical dimension less than 35 nm (nanometers) and an aspect ratio relating a height of the feature pattern to the critical dimension exceeding 5:1.

DETAILED DESCRIPTION OF SEVERAL EMBODIMENTS

In the following description, for purposes of explanation and not limitation, specific details are set forth, such as a various lithographic processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

In material processing methodologies, pattern etching can comprise the application of a thin layer of photo-sensitive material, such as photoresist, to an upper surface of a substrate, followed by patterning of the thin layer of material using a lithographic process. During pattern etching, a dry plasma etching process can be utilized, wherein plasma is formed from a process gas by coupling electro-magnetic (EM) energy, such as radio frequency (RF) power, to the process gas in order to heat electrons and cause subsequent ionization and dissociation of the atomic and/or molecular constituents of the process gas. Using a series of dry etching processes, the pattern formed in the thin layer of photo-sensitive material is transferred to the underlying layers within a film stack, including the one or more material layers that are desired for the end product, e.g., an electronic device.

Figure 1:
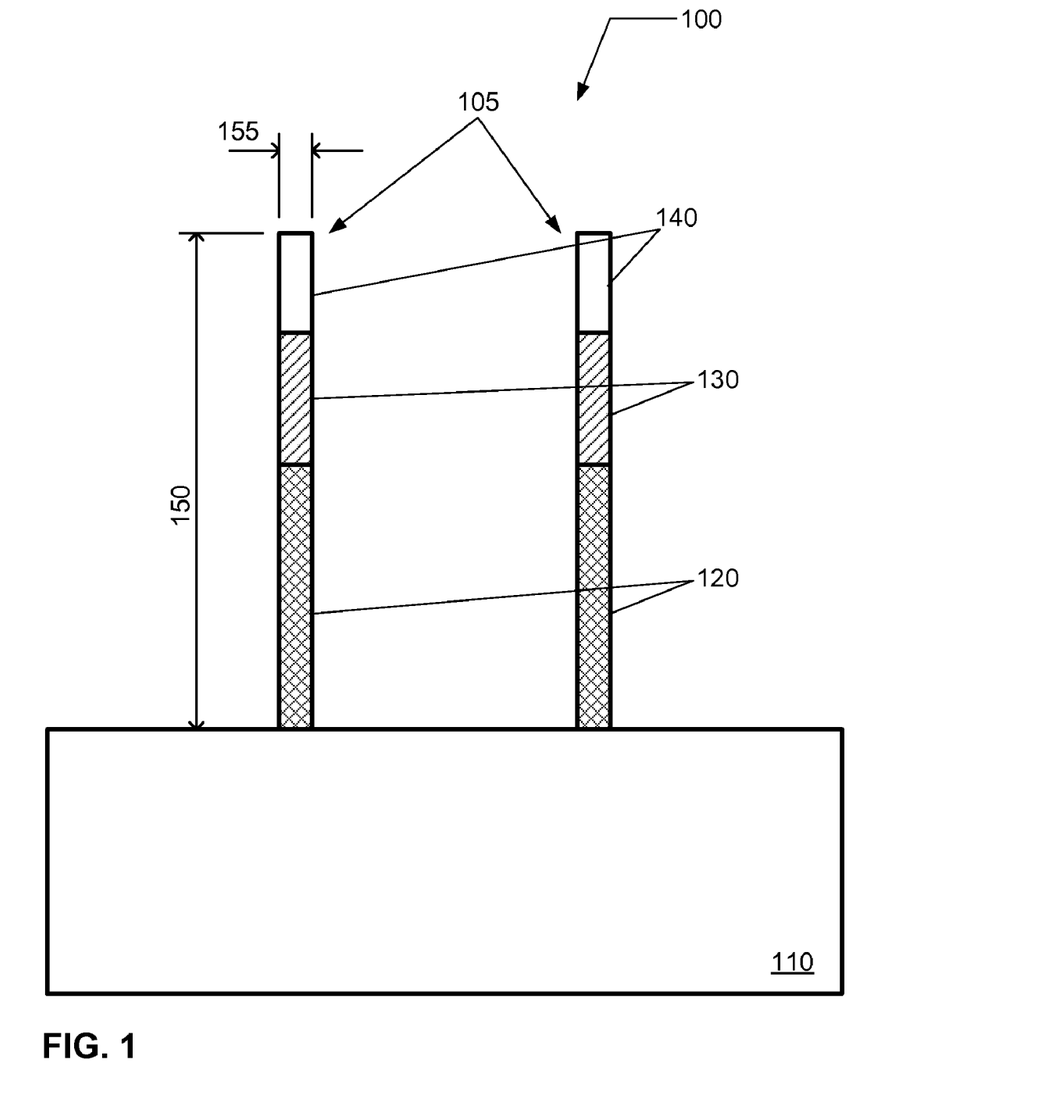
FIG. 1 illustrates a feature pattern formed in a spin-on layer according to an embodiment.

During the lithographic process, intermediate layers are introduced to complement the layer of photo-sensitive material. These intermediate layers may provide anti-reflective properties for the lithographic process, etch resistance as a hard mask layer for the subsequent etching process, planarization of the substrate, etc. For example, as illustrated in FIG. 1, a high aspect ratio pattern 100 is prepared in a series of layers on a substrate 110 via lithographic and etching processes. The series of layers includes a spin-on layer 120, such as a spin-on planarization layer, an anti-reflective coating (ARC) layer 130, and a layer of photo-sensitive material 140.

After patterning the layer of photo-sensitive material 140 using the lithographic process, the pattern is transferred to the underlying ARC layer 130 and spin-on layer 120 using a sequence of etching processes to form a feature pattern 105. The feature pattern 105 may include one or more high-aspect ratio feature elements that are characterized by a height 150 and a critical dimension (CD) 155. In advanced device structures, the aspect ratio relating the height 150 of the feature pattern 105 to the critical dimension 155 may become large, e.g., may exceed 5:1, 10:1, or 20:1.

As described above, spin-on layers are presently in use to serve some or all of the functions described above to complement the layer of photo-sensitive material. The selection of spin-on layers may be due in part to their relatively low cost for application. However, as pattern feature critical dimensions decrease and pattern feature aspect ratios increase, spin-on layers suffer mechanical breakdown in subsequent processes, including pattern defectivity/deformation and even more catastrophic failures, such as pattern collapse. For instance, spin-on layers, such as spin-on layer 120 in FIG. 1, may collapse or fall over when subjected to uneven stresses during wet cleaning cycles.

Therefore, a method for patterning a substrate and, in particular, a method for patterning a substrate with mechanically robust, high aspect ratio features is described. The method may improve the preparation of high quality feature patterns and reduce the propensity for defectivity.

Figure 2:
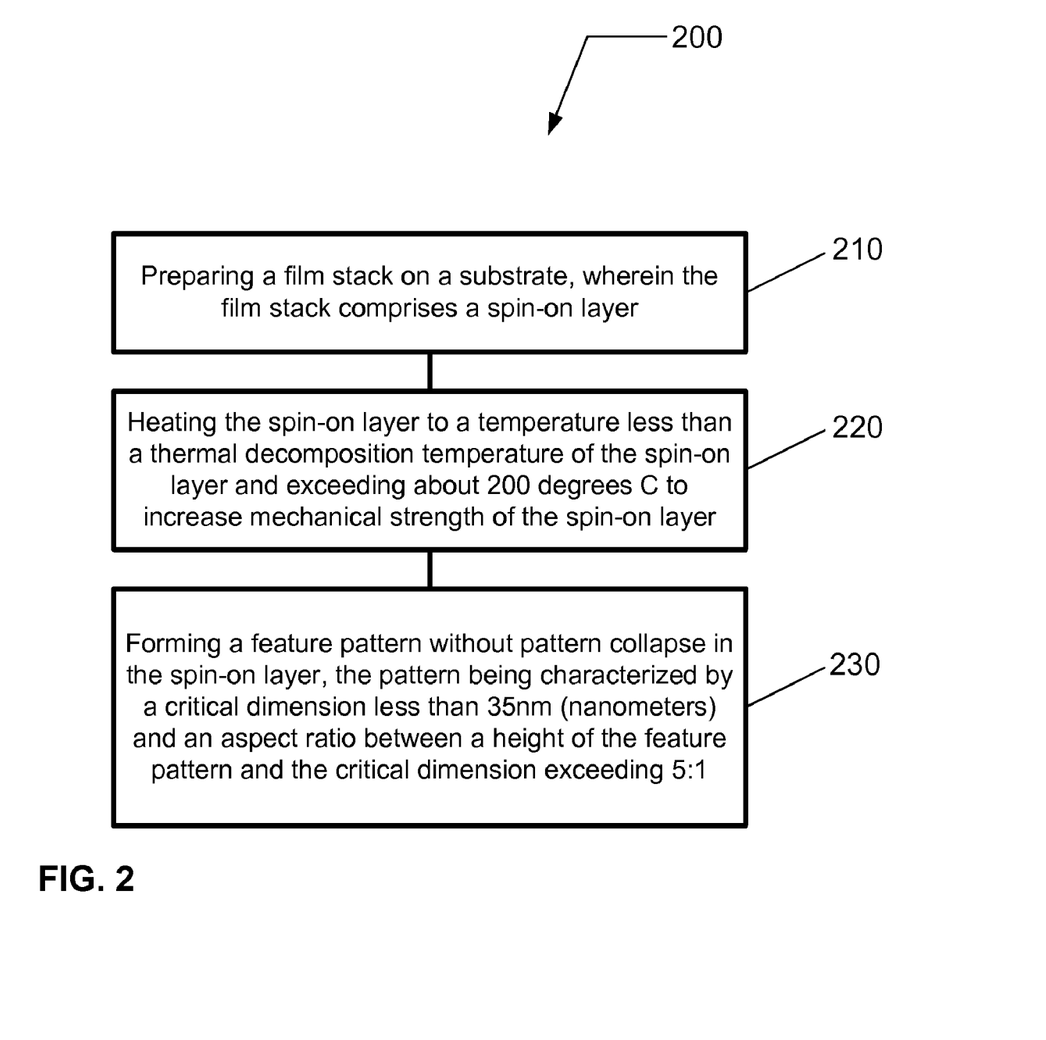
FIG. 2 provides a flow chart illustrating a method for patterning a substrate according to another embodiment.

According to an embodiment, a method of patterning a structure on a substrate is schematically illustrated in a flow chart 200 in FIG. 2. The method begins in 210 with preparing a film stack on a substrate, wherein the film stack comprises a spin-on layer. The film stack may further comprise an anti-reflective coating (ARC) layer overlying the spin-on layer.

The spin-on layer may serve as a hard mask layer, or a planarization layer, or both a hard mask layer and a planarization layer in the film stack. As a hard mask layer, the spin-on layer may provide additional etch resistance during subsequent pattern transfer in an etching process. As a planarization layer, the spin-on layer may provide a planar upper surface overlying complex, underlying surface topography.

The spin-on layer may include a spin-on organic polymer. The spin-on layer may include a spin-on carbon layer. The spin-on carbon layer may comprise an organic polymer having a carbon content in excess of 80 wt. %. Alternatively, the spin-on carbon layer may comprise an organic polymer having a carbon content in excess of 90 wt. %.

The spin-on layer may include a spin-on material commercially available from JSR Micro, Inc. (1280 North Mathilda Avenue, Sunnyvale, Calif. 94089), such as HM8500. Alternatively, the spin-on layer may include a spin-on material commercially available from Shin-Etsu Chemical Company, Ltd. (6-1, Ohtemachi 2-chome, Chiyoda-ku, Tokyo 100-0004, Japan), such as the ODL series, i.e., ODL301 or ODL102.

The spin-on layer may be formed using a track system. For example, the track system may comprise a CLEAN TRACK ACT 8, ACT 12, or LITHIUS resist coating and developing system commercially available from Tokyo Electron Limited (TEL). Other systems and methods for forming a spin-on film on a substrate are well known to those skilled in the art of spin-on resist technology. The coating of the spin-on layer may include any or all processes known to those skilled in the art of preparing such films. For example, the coating process may be preceded by a cleaning process and the coating process may be followed by one or more post-application bakes (PAB) to heat the substrate to a cure temperature and one or more cooling cycles, following the one or more PABs, to cool the substrate.

In 220, the spin-on layer is heated to a cure temperature less than a thermal decomposition temperature of the spin-on layer and exceeding about 200 degrees C. to increase mechanical strength of the spin-on layer. Alternatively, the cure temperature exceeds 210 degrees C. Alternatively, the cure temperature exceeds 220 degrees C. Alternatively, the cure temperature exceeds 230 degrees C. Alternatively, the cure temperature exceeds 240 degrees C. Alternatively, the cure temperature exceeds 250 degrees C. Alternatively, the cure temperature exceeds 260 degrees C. Alternatively, the cure temperature exceeds 270 degrees C. Alternatively, the cure temperature exceeds 280 degrees C. Alternatively, the cure temperature exceeds 290 degrees C. Alternatively, the cure temperature exceeds 300 degrees C. Alternatively, the cure temperature exceeds 310 degrees C. Alternatively, the cure temperature exceeds 320 degrees C. Alternatively, the cure temperature exceeds 330 degrees C. Alternatively, the cure temperature exceeds 340 degrees C. Alternatively, the cure temperature exceeds 350 degrees C.

In 230, a feature pattern is formed without pattern collapse in the spin-on layer, wherein the feature pattern is characterized by a critical dimension less than 35 nm (nanometers) and an aspect ratio relating a height of the feature pattern to the critical dimension exceeding 5:1. Alternatively, the feature pattern may include a critical dimension less than 30 nm. Alternatively, the feature pattern may include a critical dimension less than 25 nm. Alternatively yet, the feature pattern may include a critical dimension less than 20 nm. Alternatively, the aspect ratio may exceed 8:1. Alternatively, the aspect ratio may exceed 10:1. Alternatively, the aspect ratio may exceed 15:1. Alternatively, the aspect ratio may exceed 20:1.

The feature pattern may be prepared using a single patterning lithographic process, a multi-patterning lithographic process, a positive-tone lithographic process, a negative-tone lithographic process, a dual-tone lithographic process, or a double patterning lithographic process. For example, the feature pattern may be formed in a layer of photo-sensitive material using a single patterning lithographic process, and the feature pattern prepared in the layer of photo-sensitive material may be transferred to the underlying spin-on layer using a sequence of one or more etching processes. Alternatively, as will be discussed in greater detail below, the feature pattern may be formed using one or more layers of photo-sensitive material in a multi-patterning lithographic process.

Figure 3:
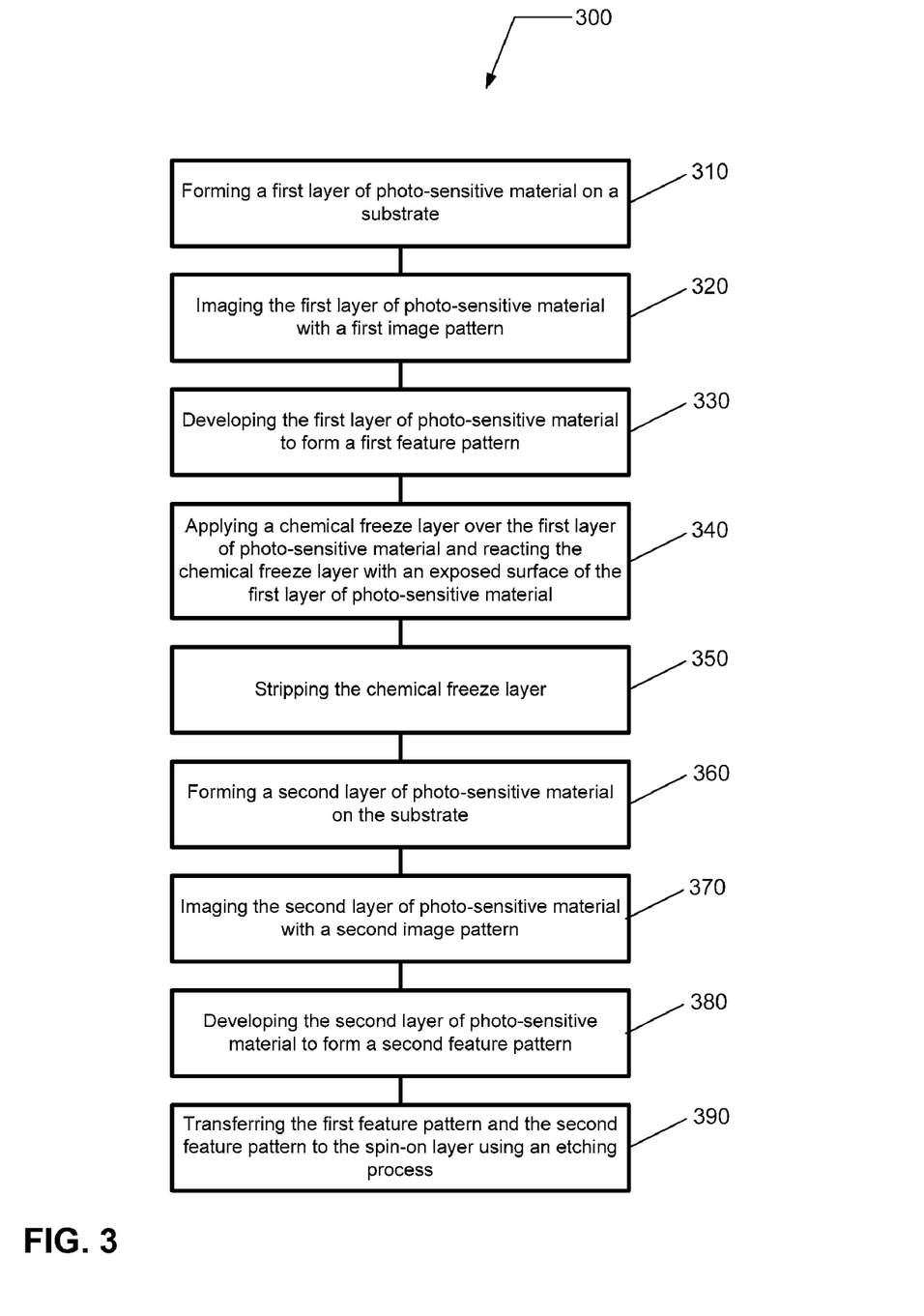
FIG. 3 provides a flow chart illustrating a lithographic process for patterning a substrate according to another embodiment.

Referring now to FIG. 3, a lithographic process for preparing a double pattern is presented according to an embodiment. The lithographic process may include a Litho-Freeze-Litho-Etch (LFLE) double patterning technique. The method includes a flow chart 300 beginning in 310 with forming a first layer of photo-sensitive material overlying a spin-on layer on a substrate. The first layer of photo-sensitive material may comprise photoresist. For example, the first layer of photo-sensitive material may include a 248 nm (nanometer) resist, a 193 nm resist, a 157 nm resist, an EUV (extreme ultraviolet) resist, or an electron sensitive resist. The photoresist layer may be formed using spin-on techniques. The first layer of photo-sensitive material may be formed using a track system. For example, the track system may comprise a CLEAN TRACK ACT 8, ACT 12, or LITHIUS resist coating and developing system commercially available from Tokyo Electron Limited (TEL). Other systems and methods for forming a photoresist film on a substrate are well known to those skilled in the art of spin-on resist technology. The coating of the photoresist layer may include any or all processes known to those skilled in the art of preparing such films. For example, the coating process may be preceded by a cleaning process and the coating process may be followed by one or more post-application bakes (PAB) to heat the substrate and one or more cooling cycles, following the one or more PABs, to cool the substrate.

In 320, the first layer of photo-sensitive material is imaged with a first image pattern. The exposure to patterned EM radiation is performed in a dry or wet photolithography system. The image pattern may be formed using any suitable conventional stepping lithography system, or scanning lithography system. For example, the photolithography system may be commercially available from ASML Netherlands B.V. (De Run 6501, 5504 D R Veldhoven, The Netherlands), or Canon USA, Inc., Semiconductor Equipment Division (3300 North First Street, San Jose, Calif. 95134). Alternatively, the first image pattern may be formed using an electron beam lithography system.

In 330, the first layer of photo-sensitive material is developed to form a first feature pattern on the substrate. For example, as described above, the first feature pattern may include a first line pattern. When subjected to the developing process, the first image pattern is removed while leaving behind the first feature pattern. The developing process can include exposing the substrate to a developing solution in a developing system, such as a track system. For example, the track system can comprise a CLEAN TRACK ACT 8, ACT 12, or LITHIUS resist coating and developing system commercially available from Tokyo Electron Limited (TEL). The developing process may be preceded by one or more post-exposure bakes (PEB) to heat the substrate and one or more cooling cycles, following the one or more first PEBs, to cool the substrate.

In 340, a chemical freeze layer is applied over the first layer of photo-sensitive material and the chemical freeze layer is reacted with an exposed surface of the first layer of photo-sensitive material. The chemical freeze layer may be formed by spin-coating the material onto the substrate. The chemical freeze layer may be formed using a track system. For example, the track system can comprise a CLEAN TRACK ACT 8, ACT 12, or LITHIUS resist coating and developing system commercially available from Tokyo Electron Limited (TEL). Other systems and methods for forming a photo-resist film on a substrate are well known to those skilled in the art of spin-on resist technology. The coating process may be followed by one or more bake processes to heat the substrate and cure at least a portion of the chemical freeze layer.

As a result of applying the chemical freeze layer to the substrate and heating the substrate, a portion of the chemical freeze layer reacts with the exposed surface of the first layer of photo-sensitive material to form a protective layer. The protective layer protects the first layer of photo-sensitive material from subsequent coating, exposing, and developing processes, hence, "freezing" the first layer of photo-sensitive material to form the frozen first layer of radiation-sensitive material.

The chemical freeze layer may include any removable material that may cause cross-linking in a layer of photo-sensitive material. The chemical freeze layer may include a polymeric material. For example, the chemical freeze layer may include a freeze material commercially available from JSR Micro, Inc. (1280 North Mathilda Avenue, Sunnyvale, Calif. 94089), including, for example, F112 freeze material. Alternatively, for example, the chemical freeze layer may include a freeze material commercially available from Rohm and Haas, a wholly owned subsidiary of Dow Chemical Company (100 Independence Mall West, Philadelphia, Pa. 19106), including, for example, SC™ 1000 Surface Curing Agents (SCA).

In 350, the chemical freeze layer is stripped from the substrate using a strip solution to preserve the first feature pattern in the frozen first layer of photo-sensitive material. The strip solution contains an active solute and may comprise an aqueous alkali solution. Additionally, the strip solution may contain a hydroxide. Additionally, the strip solution may contain a quaternary ammonium hydroxide. Furthermore, the strip solution may include tetramethyl ammonium hydroxide (TMAH).

In 360, a second layer of photo-sensitive material is formed on the substrate. In 370, the second layer of photo-sensitive material is imaged with a second image pattern. And, in 380, the second layer of photo-sensitive material is developed to form a second feature pattern on the substrate. For example, as described above, the second feature pattern may include a second line pattern interlaced with the first line pattern. When subjected to the developing process, the second image pattern is removed while leaving behind the second feature pattern.

In 390, a feature pattern, including the first feature pattern and the second feature pattern, may be transferred to the spin-on layer using an etching process. The etching process may include a dry etching process or a wet etching process. The etching process may include a dry plasma etching process or dry non-plasma etching process. The spin-on layer may overlie an anti-reflective coating (ARC) layer, a planarization layer, an organic planarization layer, an organic dielectric layer, an insulation layer, a conductive layer, a semi-conductive layer, a low dielectric constant (low-k) dielectric layer, an ultra-low-k (ULK) dielectric layer, a high dielectric constant (high-k) dielectric layer, a silicon-containing layer, or a metal-containing layer, or any combination of two or more thereof.

Figure 4:
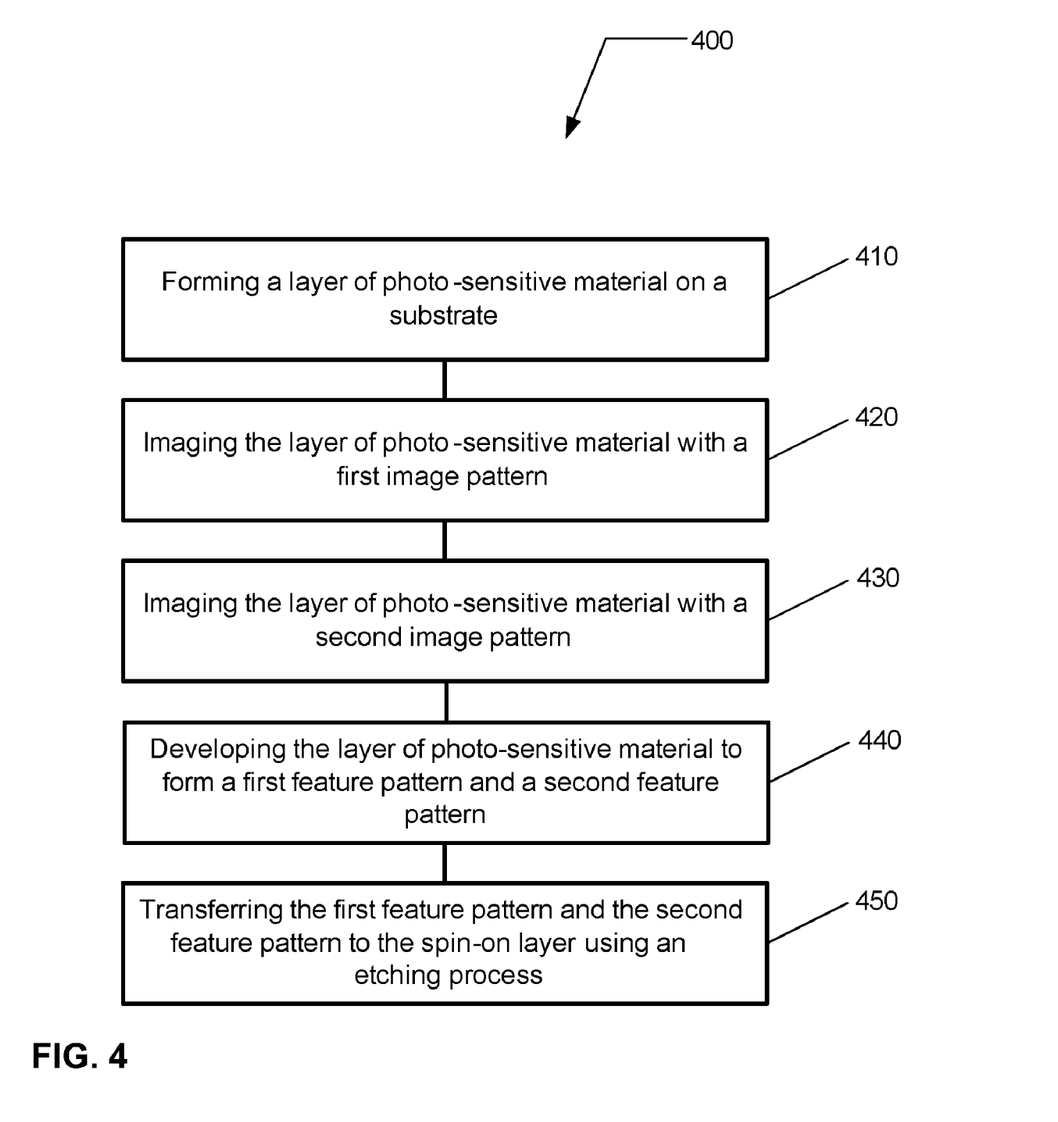
FIG. 4 provides a flow chart illustrating a lithographic process for patterning a substrate according to another embodiment.

Referring now to FIG. 4, a lithographic process for preparing a double pattern is presented according to another embodiment. The lithographic process may include a Litho-Litho-Etch (LLE) double patterning technique. The method includes a flow chart 400 beginning in 410 with forming a layer of photo-sensitive material overlying a spin-on layer on a substrate.

In 420, the layer of photo-sensitive material is imaged with a first image pattern. In 430, the layer of photo-sensitive material is imaged with a second image pattern. And, in 440, the layer of photo-sensitive material is developed to form a first feature pattern and a second feature pattern on the substrate. For example, the first feature pattern may include a first line pattern and the second feature pattern may include a second line pattern interlaced with the first line pattern. When subjected to the developing process, the first and second image patterns are removed while leaving behind the first and second feature patterns.

In 450, a feature pattern, including the first feature pattern and the second feature pattern, may be transferred to the spin-on layer using an etching process.

Figure 5:
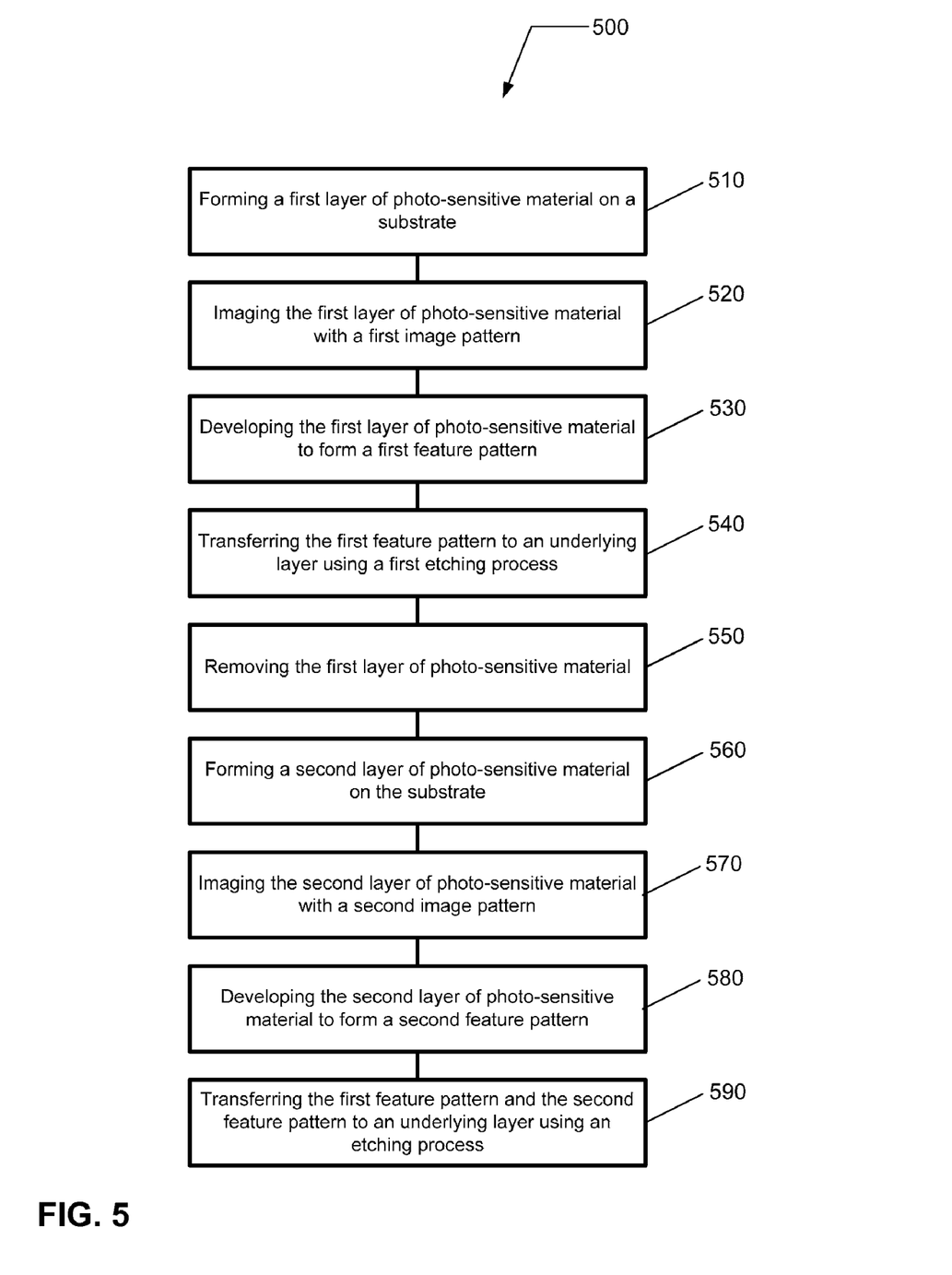
FIG. 5 provides a flow chart illustrating a lithographic process for patterning a substrate according to another embodiment.

Referring now to FIG. 5, a lithographic process for preparing a double pattern is presented according to yet another embodiment. The lithographic process may include a Litho-Etch-Litho-Etch (LELE) double patterning technique. The method includes a flow chart 500 beginning in 510 with forming a first layer of photo-sensitive material overlying a spin-on layer on a substrate.

In 520, the first layer of photo-sensitive material is imaged with a first image pattern. In 530, the first layer of photo-sensitive material is developed to form a first feature pattern on the substrate. And, in 540, the first feature pattern is transferred to the spin-on layer or an intermediate layer between the spin-on layer and the first layer of photo-sensitive material using a first etching process to form part of a feature pattern using a first etching process.

In 550, the first layer of photo-sensitive material is removed. The first layer of photo-sensitive material may be removed using a wet or dry stripping/ashing process.

In 560, a second layer of photo-sensitive material is formed overlying the spin-on layer on the substrate. In 570, the second layer of photo-sensitive material is imaged with a second image pattern. In 580, the second layer of photo-sensitive material is developed to form a second feature pattern on the substrate. And, in 590, the second feature pattern is transferred to the spin-on layer or an intermediate layer between the spin-on layer and the first layer of photo-sensitive material using a second etching process to complete the feature pattern.

Figure 6:
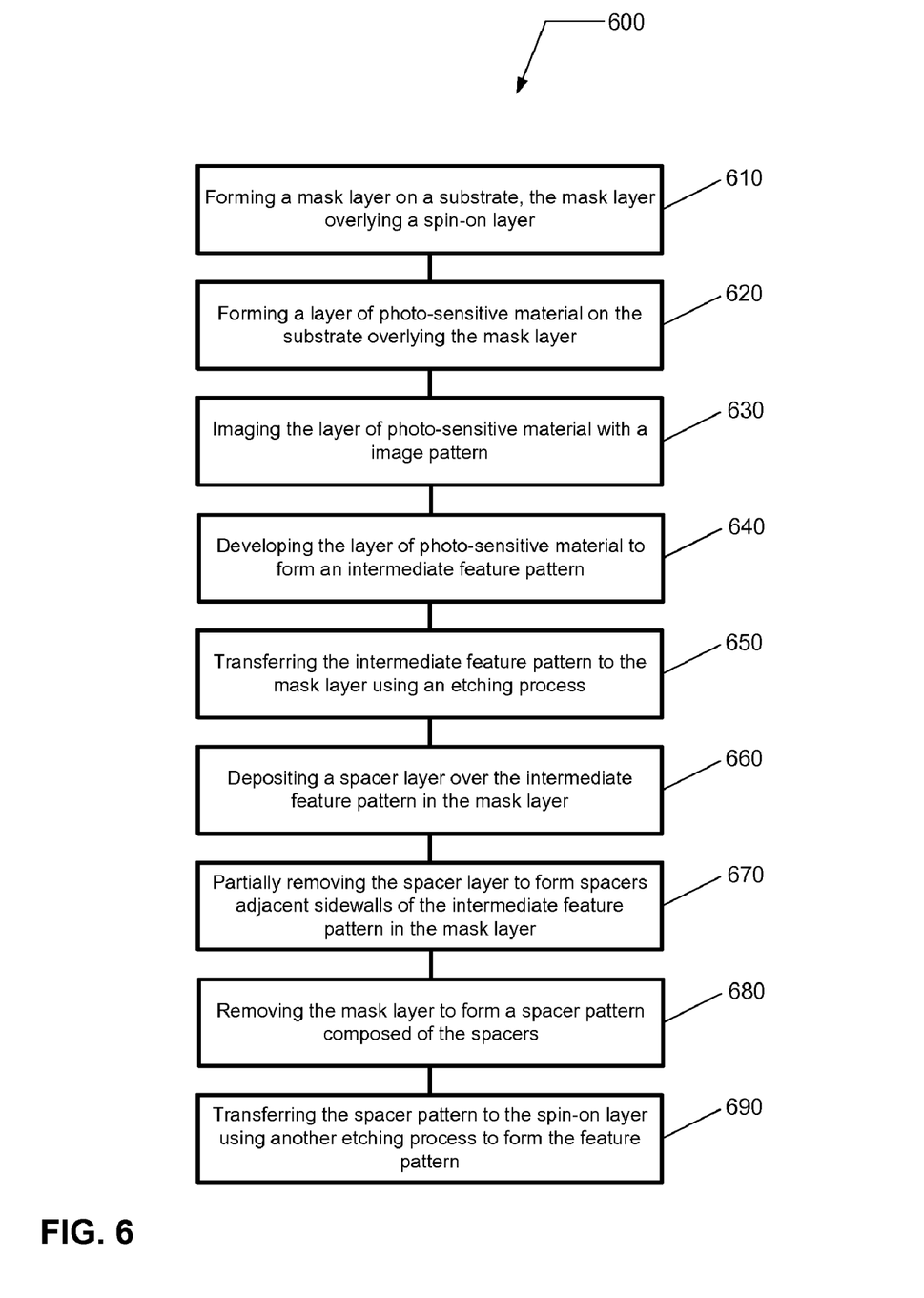
FIG. 6 provides a flow chart illustrating a lithographic process for patterning a substrate according to another embodiment.

Referring now to FIG. 6, a lithographic process for preparing a double pattern is presented according to yet another embodiment. The lithographic process may include a spacer double patterning technique. The method includes a flow chart 600 beginning in 610 with forming a mask layer on a substrate, wherein the mask layer overlies a spin-on layer.

In 620, a layer of photo-sensitive material is formed on the substrate overlying the mask layer.

In 630, the layer of photo-sensitive material is imaged with an image pattern.

In 640, the layer of photo-sensitive material is developed to form an intermediate feature pattern.

In 650, the intermediate feature pattern is transferred to the mask layer using an etching process.

In 660, a spacer layer is deposited over the intermediate feature pattern in the mask layer.

In 670, the spacer layer is partially removed to form spacers adjacent sidewalls of the intermediate feature pattern in the mask layer.

In 680, the mask layer is removed to form a spacer pattern composed of the spacers.

In 690, the spacer pattern is transferred to the spin-on layer using another etching process to form a feature pattern.

Figure 7:
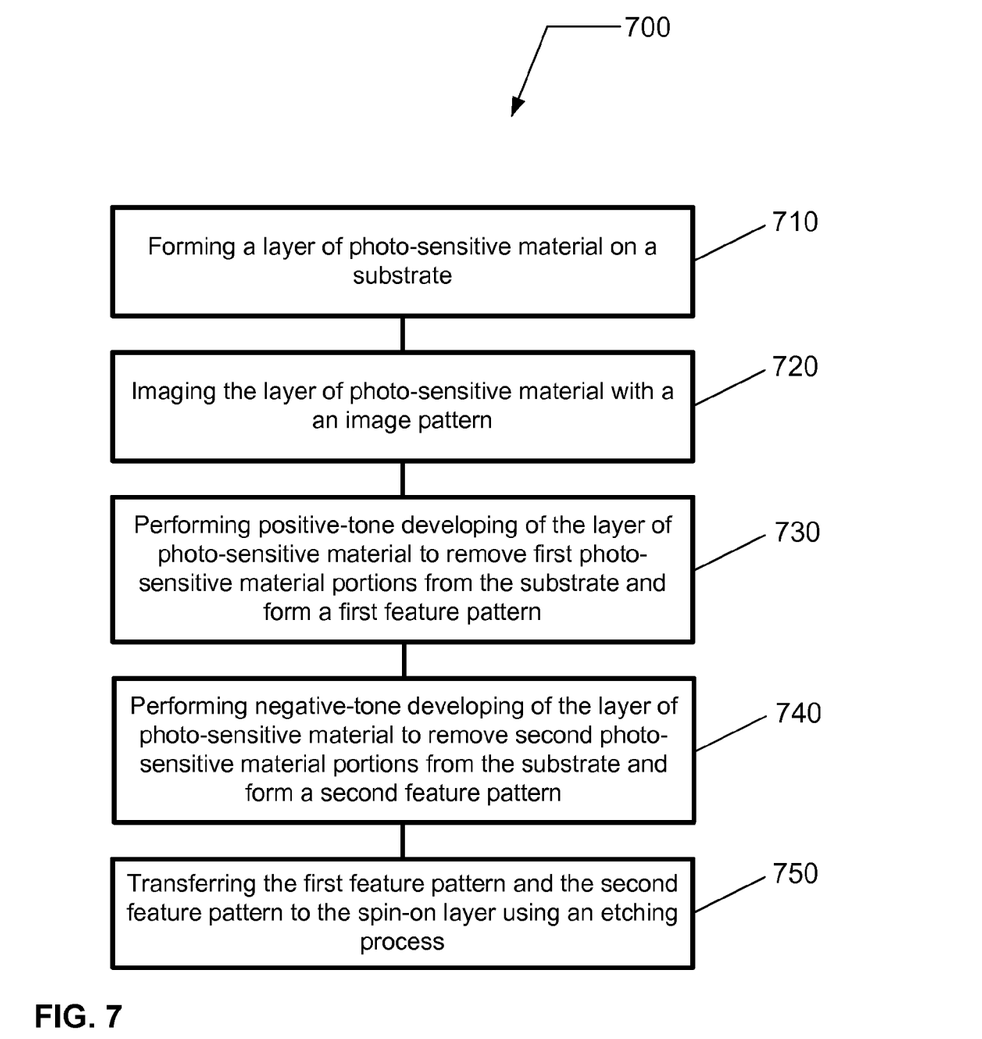
FIG. 7 provides a flow chart illustrating a lithographic process for patterning a substrate according to yet another embodiment.

Referring now to FIG. 7, a lithographic process for preparing a double pattern is presented according to yet another embodiment. The lithographic process may include a dual-tone double patterning technique. The method includes a flow chart 700 beginning in 710 with forming a layer of photo-sensitive material on a substrate, wherein the layer of photo-sensitive material overlies a spin-on layer.

In 720, the layer of photo-sensitive material is imaged with an image pattern.

In 730, positive-tone developing of the layer of photo-sensitive material is performed to remove first photo-sensitive material portions from the substrate and form a first feature pattern.

In 740, negative-tone developing of the layer of radiation-sensitive material is performed to remove second radiation-sensitive material portions from the substrate and form a second feature pattern.

In 750, the first feature pattern and the second feature pattern are transferred to the spin-on layer using an etching process to form a feature pattern.

According to one example, a high aspect ratio feature pattern is formed in an anti-reflective coating (ARC) layer overlying a spin-on layer using a spacer double patterning technique. In a first example, the spin-on layer includes HM8500 which is heated to a cure temperature of about 350 degrees C. In a second example, the spin-on layer includes ODL301 which is heated to a cure temperature in the range of about 270 degrees C. to about 300 degrees C. In a third example, the spin-on layer includes ODL102 which is heated to a cure temperature of about 200 degrees C. A high aspect ratio feature pattern including lines having a critical dimension of about 25 nm and an aspect ratio greater than 8:1 was formed in each of the three spin-on layers. In the first example, the spin-on layer (HM8500), which was heated to a high cure temperature, was prepared with reduced defectivity and without pattern collapse.

Although only certain embodiments of this invention have been described in detail above, those skilled in the art will readily appreciate that many modifications are possible in the embodiments without materially departing from the novel teachings and advantages of this invention. For example, negative resist equivalents of processes 200, 300, 400, 500, and 600 may be used. Accordingly, all such modifications are intended to be included within the scope of this invention.

The invention claimed is:

1. A method of patterning a substrate, comprising:
preparing a film stack on a substrate, said film stack comprising a spin-on layer;
heating said spin-on layer to a cure temperature less than a thermal decomposition temperature of the material of said spin-on layer and exceeding about 200 degrees C. to increase mechanical strength of the material of said spin-on layer; and
forming a feature pattern without pattern collapse in said spin-on layer by removing portions of said spin-on layer to define one or more feature elements comprising the material of increased mechanical strength and having a critical dimension that is the width of said one or more feature elements, said feature pattern being characterized by said critical dimension being less than 35 nm (nanometers) and an aspect ratio relating a height of said feature pattern to said critical dimension exceeding 5:1.

2. The method of claim 1, wherein said spin-on layer serves as a hard mask layer, or a planarization layer, or both a hard mask layer and a planarization layer in said film stack.

3. The method of claim 1, wherein said film stack comprises an anti-reflective coating layer formed on said spin-on layer.

4. The method of claim 1, wherein said spin-on layer comprises a spin-on organic polymer.

5. The method of claim 1, wherein said cure temperature exceeds 250 degrees C.

6. The method of claim 1, wherein said cure temperature exceeds 270 degrees C.

7. The method of claim 1, wherein said cure temperature exceeds 300 degrees C.

8. The method of claim 1, wherein said cure temperature exceeds 330 degrees C.

9. The method of claim 1, wherein said aspect ratio exceeds 8:1.

10. The method of claim 1, wherein said aspect ratio exceeds 10:1.

11. The method of claim 1, wherein said critical dimension is less than or equal to 25 nm.

12. The method of claim 1, wherein said spin-on layer comprises a spin-on carbon layer.

13. The method of claim 12, wherein said spin-on carbon layer comprises an organic polymer having a carbon content in excess of 80 wt. %.

14. The method of claim 12, wherein said spin-on carbon layer comprises an organic polymer having a carbon content in excess of 90 wt. %.

15. The method of claim 1, wherein said forming said pattern comprises forming said pattern using a single patterning lithographic process or a multi-patterning lithographic process.

16. The method of claim 15, wherein said multi-patterning lithographic process comprises:
   forming a first layer of photo-sensitive material on said substrate overlying said spin-on layer;
   imaging said first layer of photo-sensitive material with a first image pattern;
   developing said first layer of photo-sensitive material to form a first feature pattern;
   applying a chemical freeze layer over said first layer of photo-sensitive material and reacting said chemical freeze layer with an exposed surface of said first layer of photo-sensitive material;
   stripping said chemical freeze layer;
   forming a second layer of photo-sensitive material on the substrate;
   imaging said second layer of photo-sensitive material with a second image pattern;
   developing said second layer of photo-sensitive material to form a second feature pattern; and
   transferring said first feature pattern and said second feature pattern to said spin-on layer using an etching process to form said feature pattern.

17. The method of claim 15, wherein said multi-patterning lithographic process comprises:
   forming a layer of photo-sensitive material on said substrate overlying said spin-on layer;
   imaging said layer of photo-sensitive material with a first image pattern;
   imaging said layer of photo-sensitive material with a second image pattern;
   developing said layer of photo-sensitive material to form a first feature pattern and a second feature pattern; and
   transferring said first feature pattern and said second feature pattern to said spin-on layer using an etching process to form said feature pattern.

18. The method of claim 15, wherein said multi-patterning lithographic process comprises:
   forming a first layer of photo-sensitive material on said substrate overlying said spin-on layer;
   imaging said first layer of photo-sensitive material with a first image pattern;
   developing said first layer of photo-sensitive material to form a first feature pattern;
   transferring said first feature pattern to said spin-on layer or an intermediate layer between said spin-on layer and said first layer of photo-sensitive material using a first etching process to form part of said feature pattern;
   removing said first layer of photo-sensitive material;
   forming a second layer of photo-sensitive material on said substrate;
   imaging said second layer of photo-sensitive material with a second image pattern;
   developing said second layer of photo-sensitive material to form a second feature pattern; and
   transferring said second feature pattern to said spin-on layer or an intermediate layer between said spin-on layer and said second layer of photo-sensitive material using a second etching process to complete said feature pattern.

19. The method of claim 15, wherein said multi-patterning lithographic process comprises:
   forming a layer of photo-sensitive material on said substrate, said layer of photo-sensitive material overlying a spin-on layer;
   imaging said layer of photo-sensitive material with an image pattern;
   performing positive-tone developing of said layer of photo-sensitive material to remove first photo-sensitive material portions from said substrate and form a first feature pattern;
   performing negative-tone developing of said layer of photo-sensitive material to remove second radiation-sensitive material portions from said substrate and form a second feature pattern; and
   transferring said first feature pattern and said second feature pattern to said spin-on layer using an etching process to form said feature pattern.

20. A method of patterning a substrate, comprising:
   preparing a film stack on a substrate, said film stack comprising a spin-on layer;
   heating said spin-on layer to a cure temperature less than a thermal decomposition temperature of said spin-on layer and exceeding about 200 degrees C. to increase mechanical strength of said spin-on layer; and
   forming a feature pattern without pattern collapse in said spin-on layer, said feature pattern being characterized by a critical dimension less than 35 nm (nanometers) and an aspect ratio relating a height of said feature pattern to said critical dimension exceeding 5:1, wherein said forming comprises using a multi-patterning lithographic process comprising:
   forming a mask layer on said substrate, said mask layer overlying said spin-on layer;
   forming a layer of photo-sensitive material on said substrate overlying said mask layer;

imaging said layer of photo-sensitive material with an image pattern;

developing said layer of photo-sensitive material to form an intermediate feature pattern;

transferring said intermediate feature pattern to said mask layer using an etching process;

depositing a spacer layer over said intermediate feature pattern in said mask layer;

partially removing said spacer layer to form spacers adjacent sidewalls of said intermediate feature pattern in said mask layer;

removing said mask layer to form a spacer pattern composed of said spacers; and transferring said spacer pattern to said spin-on layer using another etching process to form said feature pattern.

* * * * *